United States Patent [19]

Kobayashi

[11] Patent Number: 5,757,701
[45] Date of Patent: May 26, 1998

[54] SEMICONDUCTOR MEMORY DEVICE HAVING SERIAL ACCESS PORT

[75] Inventor: Shotaro Kobayashi, Tokyo, Japan

[73] Assignee: NEC Corporation, Tokyo, Japan

[21] Appl. No.: 691,013

[22] Filed: Aug. 5, 1996

[30] Foreign Application Priority Data

Sep. 18, 1995 [JP] Japan .................. 7-238019

[51] Int. Cl.$^6$ .................................. G11C 7/00
[52] U.S. Cl. .................. 365/189.05; 365/189.12; 365/221
[58] Field of Search .............. 365/189.05, 189.04, 365/230.05, 230.08, 221, 230.03, 189.12, 63, 51

[56] References Cited

U.S. PATENT DOCUMENTS

| | | | |
|---|---|---|---|
| 5,051,954 | 9/1991 | Toda et al. ................. | 365/189.02 |
| 5,321,646 | 6/1994 | Tomishima ................. | 365/51 |
| 5,361,236 | 11/1994 | Iwakiri ...................... | 365/221 |
| 5,463,584 | 10/1995 | Hoshino ..................... | 365/189.05 |

FOREIGN PATENT DOCUMENTS

0 335 715  10/1989  European Pat. Off. .......... G11C 7/00

*Primary Examiner*—David C. Nelms
*Assistant Examiner*—Son Mai
*Attorney, Agent, or Firm*—Young & Thompson

[57] ABSTRACT

A semiconductor memory has a serial access port transferring data consisting of a plurality of bits in a sequential manner. The serial access port includes a plurality of data registers provided correspondingly to a plurality of pairs of bit lines and divided into a plurality of groups, each of which is equal in number to the data to be transferred at one time. each of a plurality of power control transistors supplies power to one of the data registers of one group and to one of the data registers of a different group. The data registers in one group are thus supplied with power from different power control transistors.

11 Claims, 8 Drawing Sheets

SEMICONDUCTOR MEMORY DEVICE HAVING SERIAL ACCESS PORT

BACKGROUND OF THE INVENTION

The present invention relates to a semiconductor memory device and, more particularly, to a dynamic random access memory device (DRAM) that has a serial access port through which data consisting of a plurality of bits are read out of or written into selected memory cells in series.

As one of application fields of a DRAM, there is a so-called video DRAM which is used for processing video data. This DRAM has, in addition to a random access port through which data are read out of or written into selected memory cells in random, a serial access port through which data are provided to or from selected memory cells in series. In order to enhance efficiency in processing, further, a DRAM has been proposed and put into practical use that has a serial port which manipulates data consisting of a plurality of bits at one time.

Also in the above DRAM, it is required to perform data transfer at a high speed and to reduce power consumption.

For the purpose of reduction in power consumption, that a technique is employed in which each of data registers for temporarily storing serial data is deactivated or powered off before receiving data from sense amplifiers provided for sensing and amplifying data read out of memory cells. This technique will be described below in detail with reference to FIG. 1 illustrating a prior art DRAM.

Figure 1A:
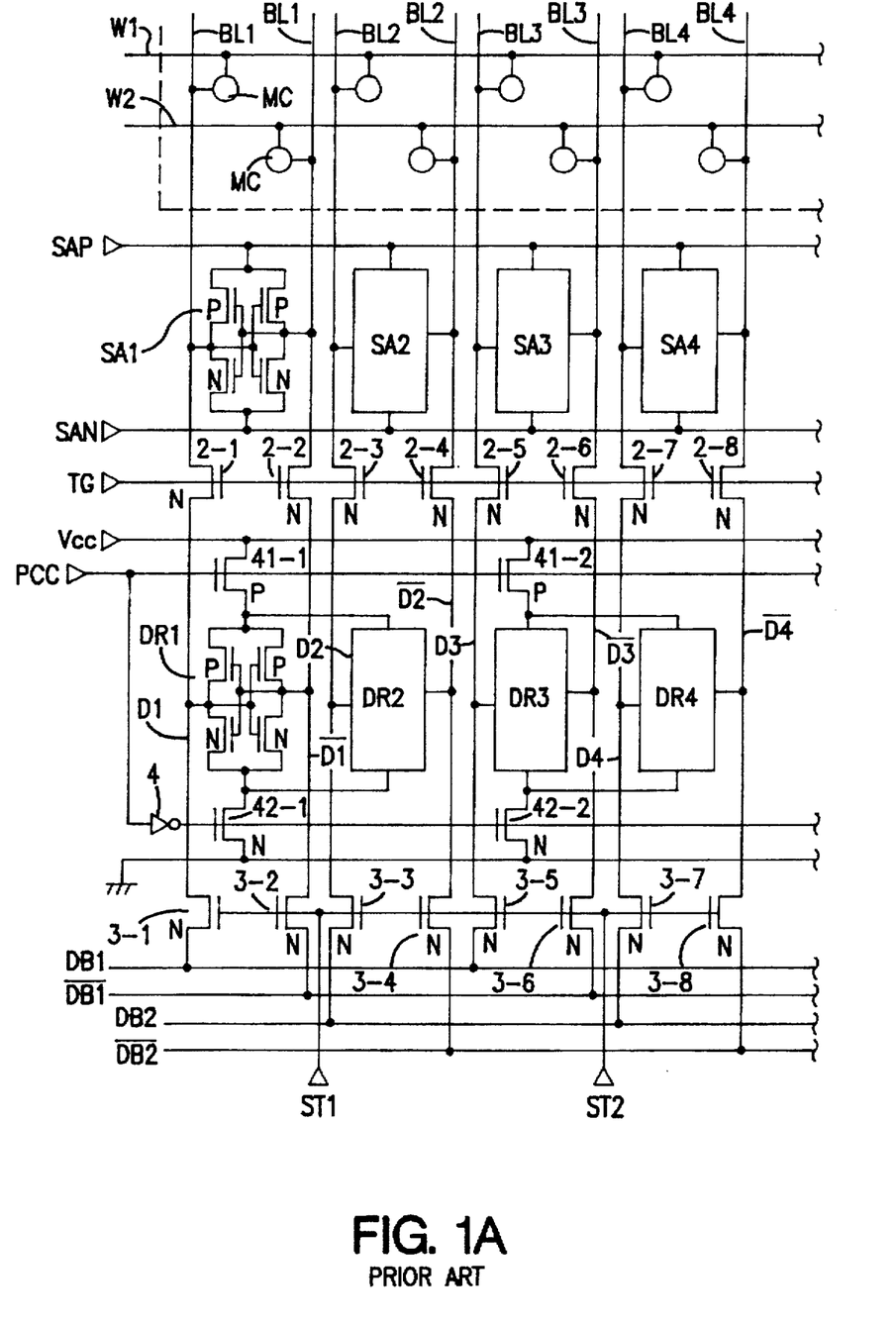
FIGS. 1A and 1B are a circuit diagram illustrative of a memory device according to the prior art.
Figure 1B:
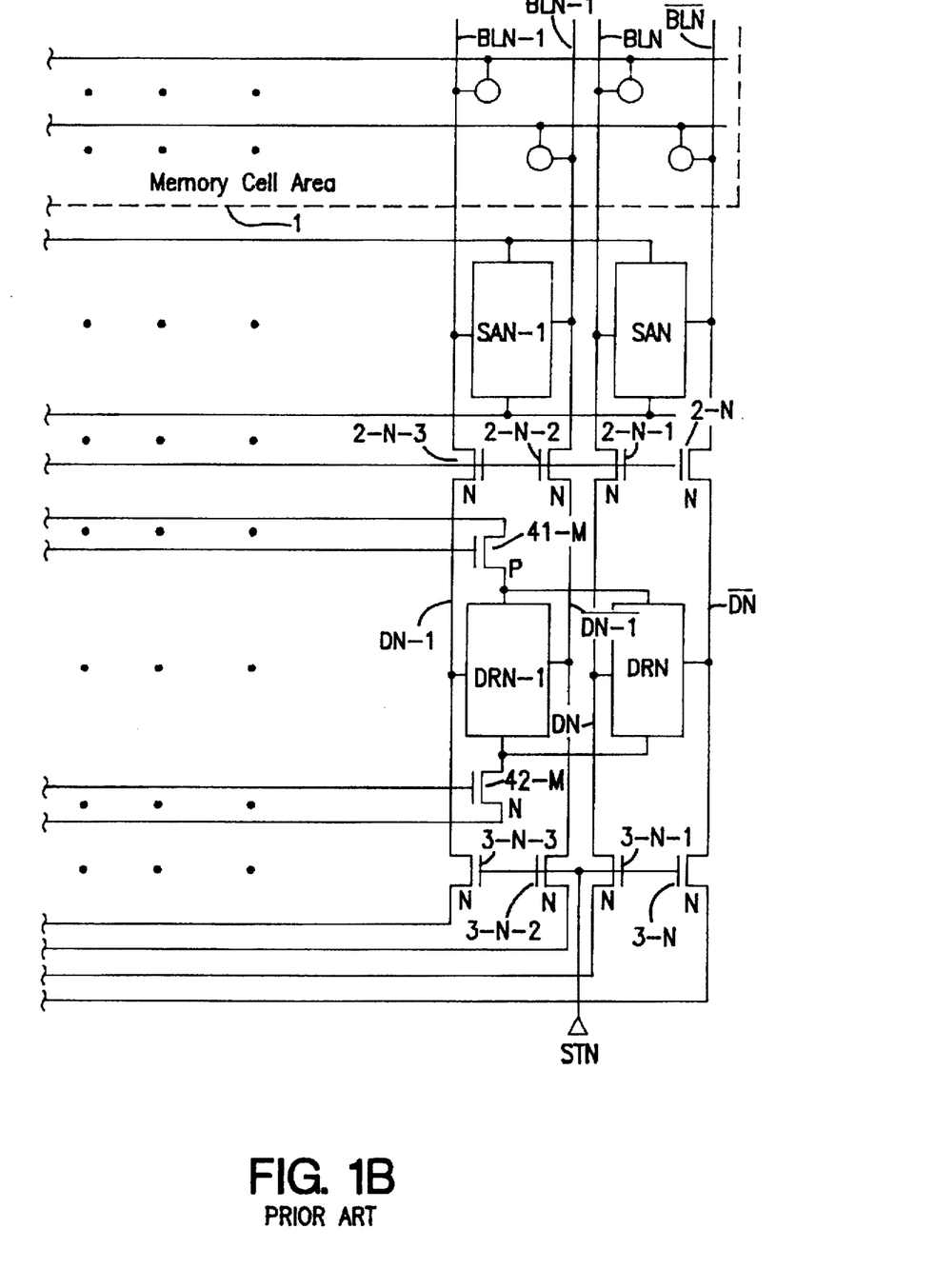

In FIG. 1, this DRAM includes a memory cell array 1 having a plurality of memory cells MC, a plurality of word lines W (only two word lines W1 and W2 being shown in the drawing), and a plurality of pairs of bit lines BL1, $\overline{BL1}$) to (BLN, $\overline{BLN}$) which are arranged in a conventional manner. For each pair of the bit lines, sense amplifiers SA1 to SAN are provided to amplifying a potential difference between the corresponding pair of bit lines. Each of the sense amplifiers SA1 to SAN is activated by sense-enable signals SAP and SAN.

The pairs of bit lines (BL1, $\overline{BL1}$) to (BLN, $\overline{BLN}$) are coupled through transfer gate transistors 2-1 to 2-N to pairs of data line (D1, $\overline{D1}$) to (DN, $\overline{DN}$), respectively. Each of the transistors 2-1 to 2-N is rendered conductive by an active level of a data transfer control signal TG. There are provided a plurality of data registers DR1 to DRN for the pairs of data lines (D1, $\overline{D1}$) to (DN, $\overline{DN}$), respectively. Although each of the data registers DR1 to DRN is activated or powered by a corresponding pair of P-channel and N-channel MOS transistors 41 and 42 controlled respectively by a power control signal PCC and an inverted signal thereof by an inverter 4, a pair of transistors 41 and 42 are provided for two data registers DR adjacent to each other. For example, the transistors 41-1 and 42-1 are provided for the data registers DR1 and DR2, the transistors 41-2 and 42-2 are for the data registers DR3 and DR4, and the transistors 41-M and 42-M are for the registers DRN-1 and DRN. This is because this DRAM performs a serial data operation in two-bit units. That is, two pairs of data-bus lines (DB1 and $\overline{DB1}$) and (DB2 and $\overline{DB2}$) are provided to transfer serial data consisting of two bits. Each pair of data-bus lines includes a true line DB and a complementary line $\overline{DB}$.

Accordingly, two pairs of bit lines adjacent to each other are coupled through corresponding selection transistors 3 to the two pairs of data-bus lines, as shown in FIG. 1. Moreover, selection control signals ST1 to STN are supplied to the selection transistors 3 as shown in FIG. 1 to perform a serial data read/write operation in two-bit units.

Next, an operation, in particular a serial data operation of this DRAM will be described below with reference also to a timing chart shown in FIG. 2.

Figure 2A:
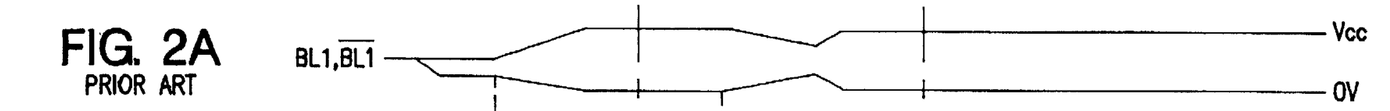
FIGS. 2A–2G are timing charts representative of an operation of the memory shown in FIGS. 1A and 1B FIGS. 3A and 3B are a circuit diagram illustrative of a memory device according to an embodiment of the present invention.

In a reset or initial state, each of the bit lines BL1 to $\overline{BLN}$ is precharged to an intermediate potential between a power supply potential Vcc and a ground potential level. When one of the word lines W, the word line W1 for example, is selected by a set of address signals (not shown) to designate the memory cells MC connected thereto, a potential difference occurs between each pair of bit lines BL in response to the data stored in the designated memory cell MC. For example, if the most left-hand memory cell of the cells MC connected to the selected word line W1 stores the data "0", the potential level on the bit line BL1 is lowered from the precharged level, as shown in FIG. 2A.

Figure 2B:
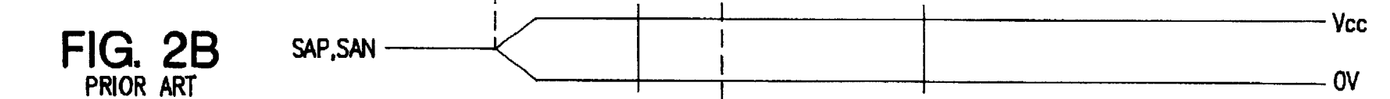
Figure 2C:
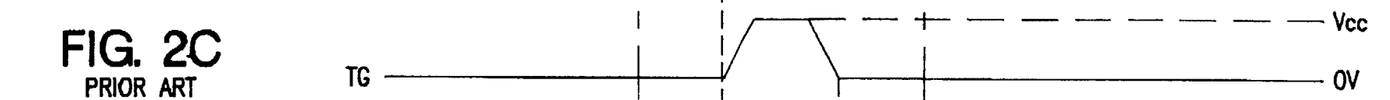
Figure 2D:
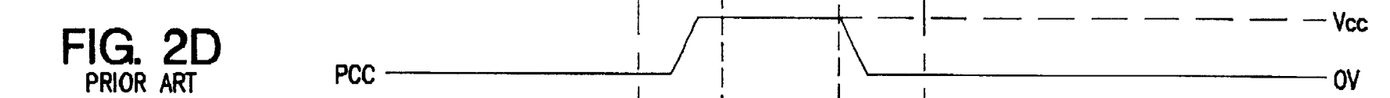
Figure 2E:
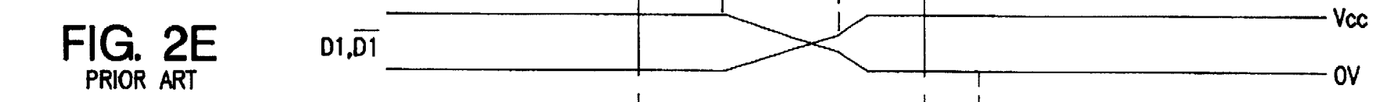
Figure 2F:
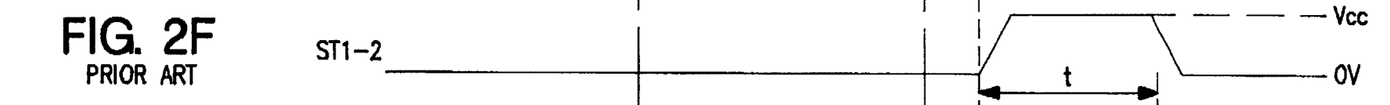
Figure 2G:
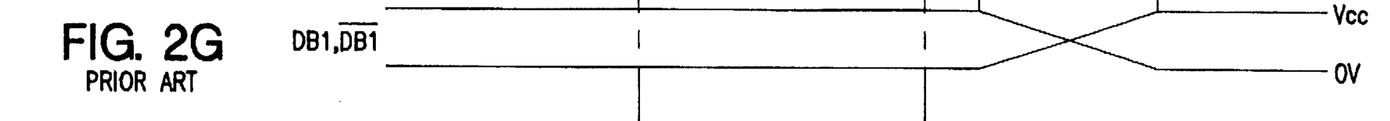

The sense-enable signals SAP and SAN are then changed to the respective active levels, as shown in FIG. 2B. Each of the sense amplifiers SA1 to SAN is thereby activated to amplify the potential difference between the corresponding pair of bit lines. Thus, the bit line BL1 is changed to the ground level and the bit line $\overline{BL1}$ is changed to the Vcc level as shown in FIG. 2C.

Next, the power control signal PCC is brought into an inactive high level to render each of the transistors 41 and 42 non-conductive. Each of the data registers DR1 to DRN is thus deactivated to bring the input/output end thereof, i.e. each of the data line D, into a high impedance state. During this state, the data transfer control signal TG is changed to the active high level, as shown in FIG. 2C. Each of the transistors 2-1 to 2-N are thereby turned ON to transfer the output data of each of the sense amplifiers SA1 to SAN to a corresponding one of the pair of data lines D.

The power control signal pcc is then changed to the active low level to activate each of the data registers DR1 to DRN. As a result, the data registers DR1 to DRN store the data read out of the memory cells MC connected to the selected word line W1.

Here, if the power voltage would be continued to be supplied to the data registers DR1 to DRN during the conduction of the transistors 2-1 to 2-N, each of the sense amplifiers would be required to not only change the data lines but also change the content of each of the data registers DR1 to DRN. For this reason, a large current would flow to consume a large power.

In the DRAM as shown in FIGS. 1A and 1B, therefore, the supply of power to the data registers DR is suspended by means of the transistors 41 and 42 during the data transfer from the bit lines BL to the data lines DL. Accordingly, each of the sense amplifiers SA1 to SAN is required to charge or discharge only the corresponding pair of data lines DL, thereby making it possible to reduce power consumption as well as to shorten the time required for data level inversion.

The selection control signals ST1 to STN are thereafter brought into an active high level in consecutive order. By the active high level of the selection signal ST1, the transistors 3-1 to 3-4 are turned ON to allow the data registers DR1 and DR2 to transfer the data stored therein onto the data buses (DB1, $\overline{DB1}$) and (DB2 and $\overline{DB2}$), respectively, as shown in FIG. 2. Thus, the data of the registers DR1 to DRN are outputted in sequence two-bit by two-bit.

In the above DRAM, however, each pair of power control transistors 41 and 42 are provided for each pair of data registers DR1 and DR2, DR3 and DR4, and DRN-1 and DRN, which are selected simultaneously by the corresponding selection control signal ST. For this reason, the drive capability of the data-bus lines DB by the selected data registers DR is restricted to lower the data transfer speed.

More specifically, since each of the data-bus lines DB has a relatively large stray capacitance, a large current is needed to drive it at a high speed. That is, each of the data registers DR preferably has a large current drive capability. However, the currents flowing through, for example the data registers DR1 and DR2 are supplied from the common transistor 41-1 (or 42-1). In other words, the current flowing through the transistor 41-1 branches to the registers DR1 and DR2. On the other hand, each of the power control transistors 41 and 42 is required to be formed in a small size, so that it can supply only a small current. As a result, the driving capability of each data register is restricted, thereby lowering a data transfer speed, as apparent from the signal waveform of the data-bus DB shown in FIG. 26.

It would be possible to provide an individual power control transistor for each of the data registers DR. In this case, however, a large number of power control transistors are required with a resulting increase in chip area.

SUMMARY OF THE INVENTION

It is therefore an object of the present invention to provide a semiconductor memory device having an improved serial access port.

Another object of the present invention is to provide a semiconductor memory device operating at a high speed with low power consumption and a small chip size.

A semiconductor memory device according to the present invention achieves these objects by providing a current flowing through each of the power control transistors that branches to one of a set of data registers which are selected simultaneously by one of selection signals and to one of another set of data registers which are selected simultaneously by another of the selection signals.

With the above feature, each of the data registers which are selected simultaneously is supplied with a current from a different one of the power control transistors, so that the driving capability of each of the data registers is enhanced accordingly. The driving speed for each data-bus line is thereby increased. Moreover, the power control transistors which are needed are not changed in number, resulting in no increase in chip size.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 3A:
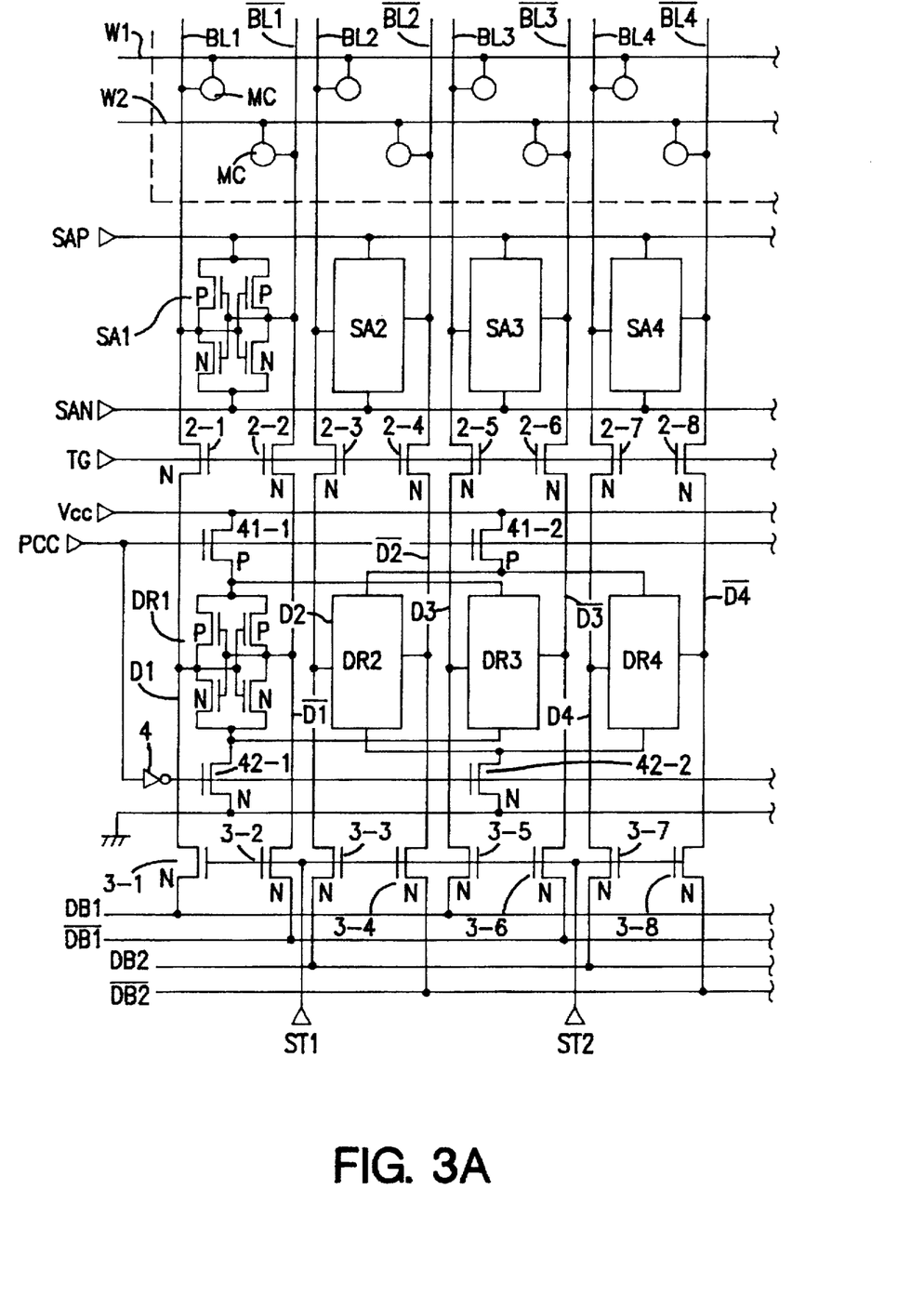
Figure 3B:
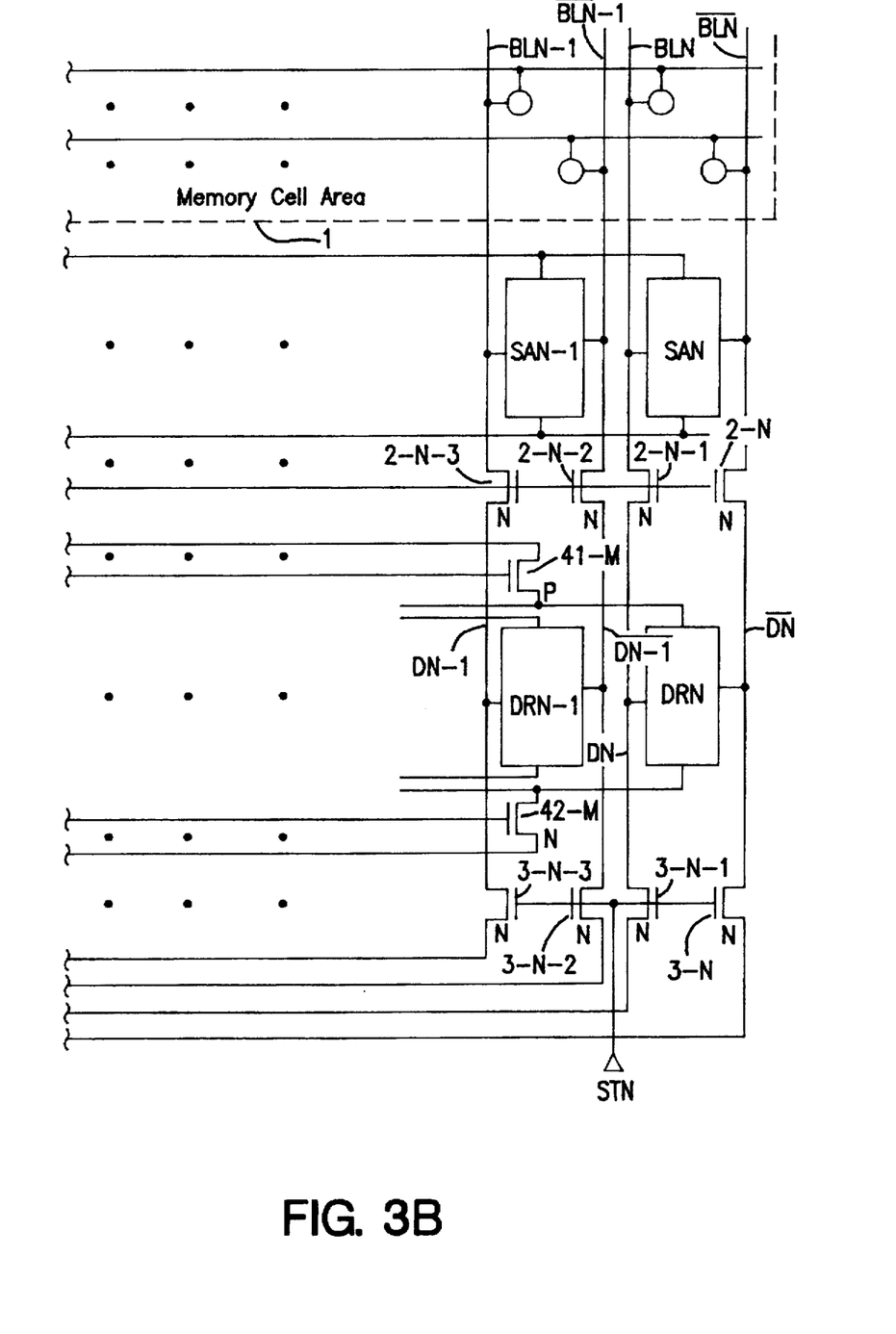

Referring now to FIGS. 3A, and 3B, there is shown a semiconductor memory device namely as a DRAM having a serial access port according to an embodiment of the present invention, in which the same constituents as those shown in FIGS. 1A and 1B are denoted by the same reference numerals to omit the further description thereof. As is apparent from the comparison between FIGS. 1A and 1B, and 3A and 3B there are provided in the DRAM of FIGS. 3A and 3B a plurality of power control transistors 41 (42) such that a power current flowing through each of the transistors 41 (42) branches to a plurality of data registers DR which belong to different sets or groups from each other. Specifically, the power control transistors 41-1 and 42-2 supply a power current to the data registers DR1 and DR3, and the transistors 41-2 and 42-2 supply a power current to the data registers DR2 and DR4. Similarly, the data register DRN is supplied with a power current from the transistors 41-N and 42-N, whereas the data register DRN-1 is supplied with a power current from another power control transistor (not shown). Stated differently, the data registers DR1 and DR2 which are selected simultaneously by the selection signal ST1 are activated or powered by the transistors 41-1 (42-1) and 41-2 (42-2), respectively.

Figures 4A, 4B:
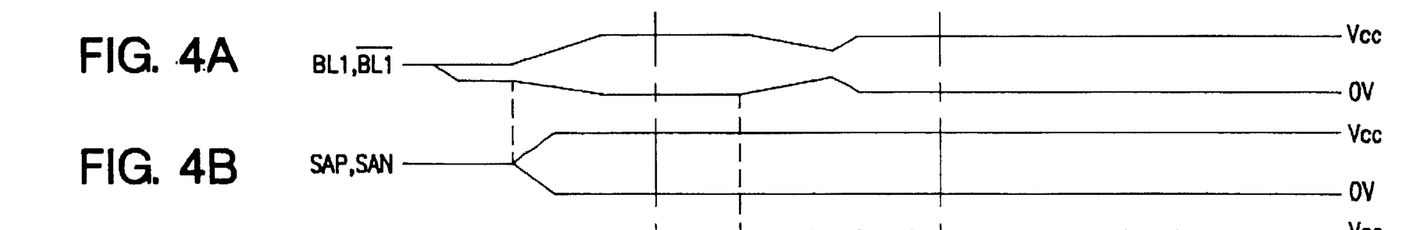
FIGS. 4A–4G are timing charts representative of an operation of the memory shown in FIG. 3.
Figure 4C:
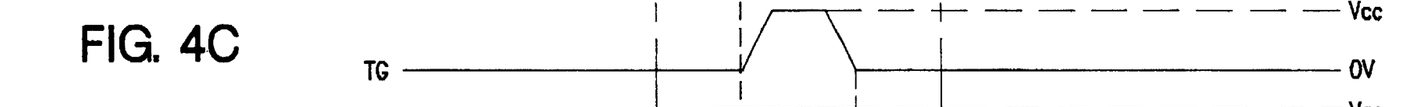
Figure 4D:
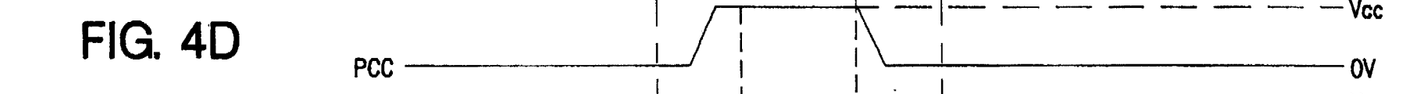
Figure 4E:
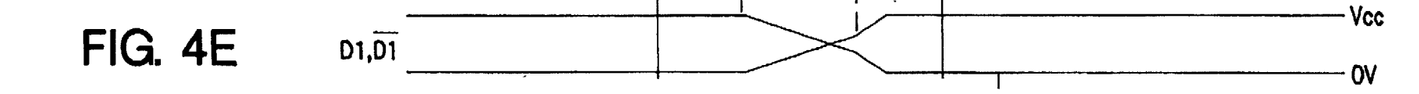
Figure 4F:
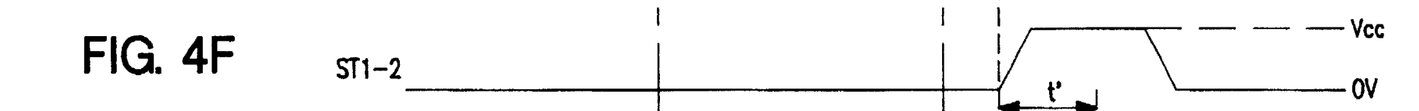
Figure 4G:
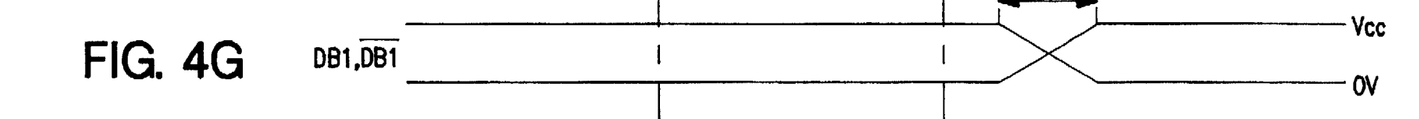

With the above construction, when the data registers DR1 and DR2 are selected by the selection signal ST1 to drive the data-bus lines (DB1 and $\overline{DB1}$) and (DB2 and $\overline{DB2}$), respectively, the current needed for the data register DR1 to drive the data-bus lines DB1 and $\overline{DB1}$ is supplied through the transistors 41-1 and 42-1, and the current needed for the data register to drive the data-bus lines DB2 and $\overline{DB2}$ is supplied through the transistors 41-2 and 42-2. These currents are apparently larger than the currents which are obtained in the memory as shown in FIGS. 1A and 1B The data-bus lines DB are thereby driven at a high speed, as shown in FIG. 4G as level waveforms of the data-bus lines DB1 and $\overline{DB1}$.

Moreover, the power control transistors 41 and 42 in the memory of FIGS. 3A and 3B are the same in number as those in the memory of FIGS. 1A and 1B Accordingly, there is no increase in chip size.

In a comparison of the electric characteristics of the memory devices of FIGS. 1A and 1B and 3A and 3B, a result has been obtained that the memory device of FIG. 3 is improved in data transfer speed by approximately 20% and in amplification gain of each data register DR by approximately 30%.

Figure 5A:
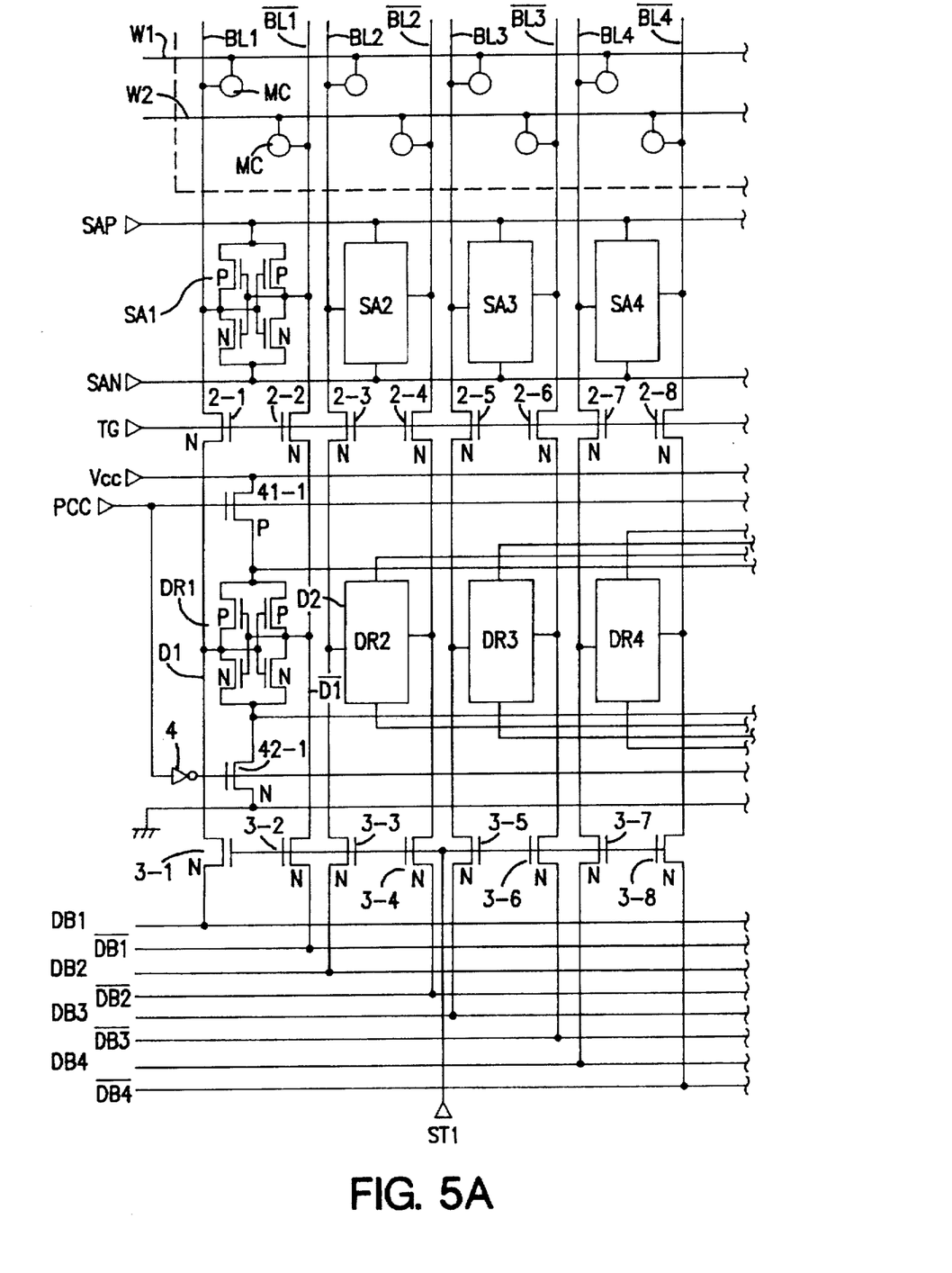
FIGS. 5A and 5B are a circuit diagram illustrative of a memory device according to another embodiment of the present invention.
Figure 5B:
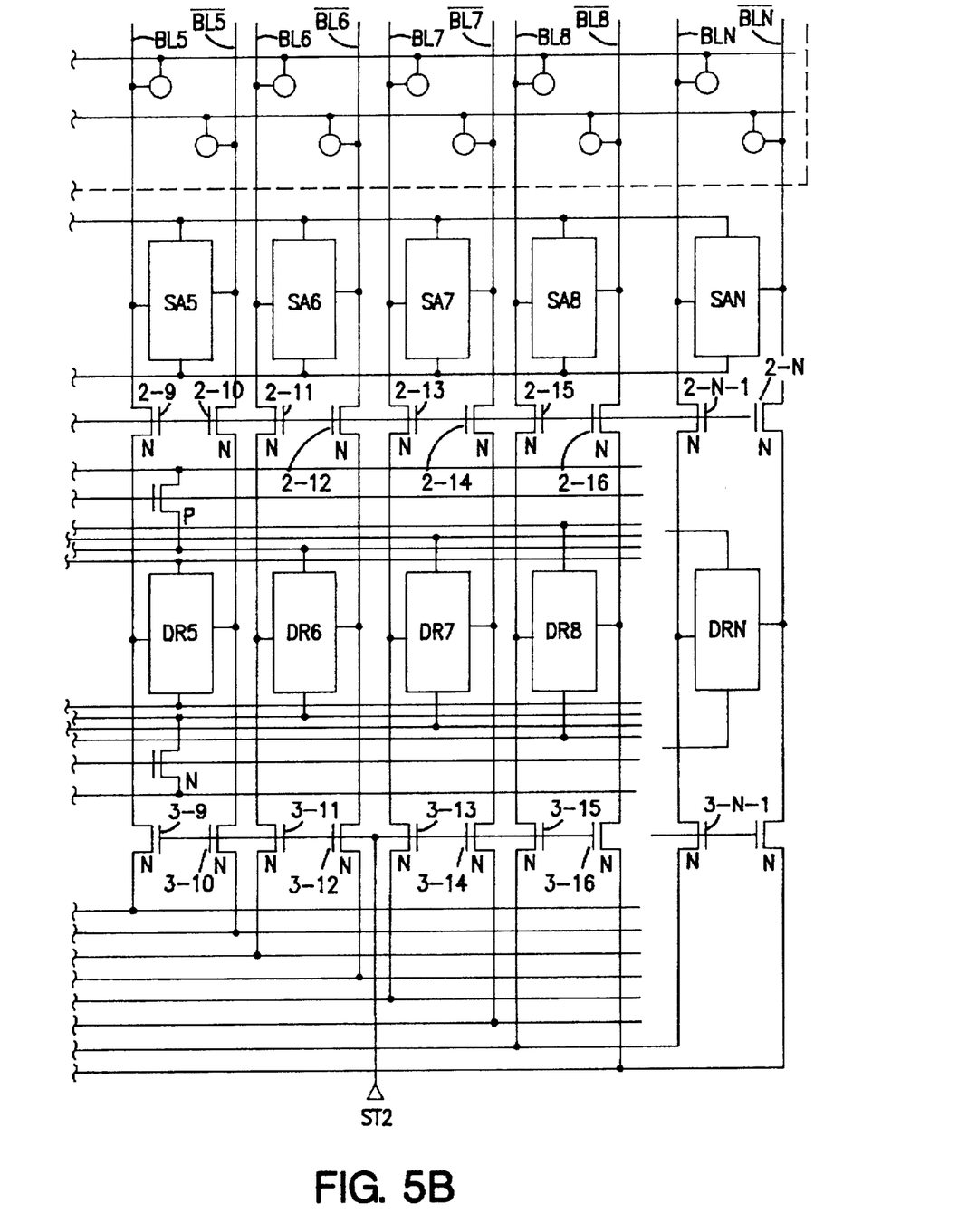

Turning to FIGS. 5A and 5B, there is shown another embodiment according to the present invention, in which the same constituents as those shown in FIGS. 3A and 3B are denoted by the same reference numerals to omit the further description thereof. In this embodiment, four-bit data are transferred at one time in a serial access mode. Accordingly, there are provided four pairs of data-bus lines (DB1 and $\overline{DB1}$) to (DB4 and $\overline{DB4}$), and fourth data registers are selected at one time by the corresponding selection signal ST.

For example, when the selection signal ST1 is changed to the active level, the data registers DR1 to DR4 are selected and connected respectively to four pairs of data-bus lines DB through the transfer gate transistors 3-1 to 3-4, respectively.

Moreover, in accordance with the present invention, the power control transistors 41-1 and 42-1 are not connected in common to the data registers DR1 to DR4, but connected to one (DR1) of the data registers DR1 to DR4, one (DR5) of the data registers DR5 to DR8 and two other registers each belongs to a different group. Accordingly, this memory presents the same effects as the memory of FIGS. 3A and 3B.

It is apparent that the present invention is not limited to the above embodiments but may be changed and modified without departing from the scope and spirit of the present invention. For example, each of the data registers and sense amplifiers can be replaced with another circuit construction.

What is claimed is:

1. A semiconductor memory device comprising a plurality of data registers, said data registers being divided into a plurality of groups each having at least two of said data registers, and a plurality of power control transistors provided such that each of said power control transistors supplies, when rendered conductive, a power current to one of the data registers of an associated one of said groups and one of the data registers of a different one of said groups.

2. The device as claimed in claim 1, wherein each of the data registers of one of said groups is selected by an associated one of selection signals to output data stored therein.

3. The device as claimed in claim 1, further comprising at least two data-bus lines and a plurality of selection transistors, said at least two data registers of each of said groups are coupled to said at least two data-bus lines through associated ones of said selection transistors, respectively.

4. A semiconductor memory device comprising a memory cell array including a plurality of word lines, a plurality of bit lines and a plurality of memory cells each coupled to one of said word lines and one of said bit lines, a plurality of data registers each having at least one input/output node and at least one power node, means for coupling, when activated, each of said bit lines to the input/output node of an associated one of said data registers, said data registers being divided into a plurality of groups each having at least two of said data registers, at least two data-bus lines, means responsive to a set of selection signals for selecting one of said groups and coupling the data registers of said one of said groups to said data-bus lines, respectively, a power supply line, and a plurality of first transistors each having a gate supplied with a power control signal and a source-drain path coupled at one end thereof to said power supply line and at the other end thereof to the power node of one of the data registers of an associated one of said groups and further to the power node of one of the data registers of a different one of said groups.

5. A semiconductor memory device comprising a memory cell array including a plurality of word lines, first to fourth bit lines and a plurality of memory cells each connected to one of said word lines and one of said first to fourth bit lines, first to fourth data lines, first to fourth transfer gate transistors each connected between an associated one of said first to fourth bit lines and an associated one of said first to fourth data lines, each of said first to fourth transfer gate transistors being controlled by a first control signal, first to fourth data registers each having an input/output node connected to an associated one of said first to fourth data lines and a power node, first and second data-bus lines, a fifth transfer gate transistor connected between said first data line and said first data-bus line and controlled by a first selection signal, a sixth transfer gate transistor connected between said second data line and said second data-bus line and controlled by said first selection signal, a seventh transfer gate transistor connected between said third data line and said first data-bus line and controlled by a second selection signal, an eighth transfer gate transistor connected between said fourth data line and said second data-bus line and controlled by said second selection signal, a power supply line, a first power control transistor connected between said power supply line and each of the power nodes of said first and third data registers, and a second power control transistor connected between said power supply line and each of the power nodes of said second and fourth data registers, each of said first and second power control transistor being controlled by a second control signal.

6. The device as claimed in claim 5, wherein said first control signal is at a level that renders said first to fourth transfer gate transistors conductive while said second control signal is at a first level that renders said first and second power control transistors non-conductive and while said second control signal is at a second level that renders said first and second power control transistors conductive.

7. The device as claimed in claim 6, wherein said first and second selection signal are generated in sequence while said second control signal is taking said second level.

8. A semiconductor memory device, comprising:

a plurality of bit lines including at least a first and a second bit line;

a plurality of data lines including at least a first and a second data line;

a plurality of data buses including at least a first data bus;

a power supply line;

a plurality of sense amplifiers including at least a first and a second sense amplifier each having a sense node, said sense node of said first sense amplifier being coupled to said first bit line, said sense node of said second sense amplifier being coupled to said second bit line;

a plurality of data registers including at least a first and a second data register each having an I/O node and power node, said I/O node of said first data register being coupled to said first data line, said I/O node of said second data register being coupled to said second data line;

a plurality of transfer gates including at least a first and a second transfer gate, said first transfer gate being coupled between said first bit line and said first data line, said second transfer gate being coupled between said second bit line and said second data line;

a plurality of selection gates including at least a first and a second selection gate, said first selection gate being coupled between said first data line and said first data bus, said second selection gate being coupled between said second data line and said first data bus; and a plurality of power supply transistors including at least a first transistor, one end of said first transistor being coupled to said power supply line, the other end of said first transistor being coupled to said power nodes of said first and second data registers.

9. The semiconductor memory device as claimed in claim 8, further comprising:

a first control line coupled to said first and second transfer gates to apply a first control signal thereto to electrically connect said first bit line and said first data line and connect said second bit line and said second data line;

a second control line coupled to said first selection gate to apply a second control signal thereto to electrically connect said first data line and said first data bus;

a third control line coupled to said second selection gate to apply a third control signal thereto to electrically connect said second data line and said first data bus; and a fourth control line coupled to said first transistor to apply a fourth control signal thereto to electrically connect said power supply line and said power nodes of said first and second data registers.

10. The semiconductor memory device as claimed in claim 9, wherein said plurality of bit lines includes a third bit line, said plurality of data lines includes a third data line, said plurality of data buses includes a second data bus, said plurality of sense amplifiers includes a third sense amplifier, said sense node of said third sense amplifier is coupled to said third bit line, said plurality of data registers includes a third data register, said I/O node of said third data register is coupled to said third data line, said plurality of transfer gates includes a third transfer gate, said third transfer gate is coupled between said third bit line and said third data line, said plurality of selection gates includes a third selection gate, said third selection gate is coupled between said third data line and said second data bus, said plurality of power supply transistor includes a second transistor, one end of said second transistor is coupled to said power supply line, and the other end of said second transistor is coupled to said power nodes of said third data register.

11. The semiconductor memory device as claimed in claim 10, wherein said first control line is further coupled to said third transfer gate to apply said first control signal thereto to electrically connect said third bit line and said third data line, said second control line is further coupled to said third selection gate to apply a third control signal thereto to electrically connect said third data line and said second data bus, said fourth control line is further coupled to said second transistor to apply said fourth control signal thereto to electrically connect said power supply line and said power node of said third data register.

* * * * *